US012787177B2

(12) United States Patent
Gavagnin et al.

(10) Patent No.: US 12,787,177 B2
(45) Date of Patent: Nov. 3, 2026

(54) COMPONENT CARRIER

(71) Applicant: AT&S Austria Technologie & Systemtechnik Aktiengesellschaft, Leoben (AT)

(72) Inventors: Marco Gavagnin, Leoben (AT); Gernot Grober, Weißkirchen (AT); Daniele Donatello, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 317 days.

(21) Appl. No.: 18/620,848

(22) Filed: Mar. 28, 2024

(65) Prior Publication Data

US 2025/0081350 A1 Mar. 6, 2025

(30) Foreign Application Priority Data

Aug. 30, 2023 (EP) .................................... 23194160

(51) Int. Cl.
*H05K 1/181* (2026.01)

(52) U.S. Cl.
CPC ... *H05K 1/181* (2013.01); *H05K 2201/10734* (2013.01); *H05K 2201/10984* (2013.01)

(58) Field of Classification Search
CPC ...................................................... H05K 1/181
USPC .......................................................... 361/779
See application file for complete search history.

(56) References Cited

U.S. PATENT DOCUMENTS

| | | | | |
|---|---|---|---|---|
| 9,761,542 | B1 | 9/2017 | Sylvestre et al. | |
| 2004/0188697 | A1 * | 9/2004 | Brunner ............... | H05K 3/3426 257/E33.059 |
| 2007/0267735 | A1 * | 11/2007 | Awano ................ | H10W 90/701 977/932 |

(Continued)

FOREIGN PATENT DOCUMENTS

| | | | |
|---|---|---|---|
| CN | 114334682 | * | 4/2022 |
| CN | 114334682 | A | 4/2022 |

(Continued)

OTHER PUBLICATIONS

European Search Report, Feb. 13, 2024 (8 pages).

*Primary Examiner* — Stanley Tso
(74) *Attorney, Agent, or Firm* — CM Law, LLP

(57) ABSTRACT

A component carrier having: a stack comprising a plurality of electrically conductive layer structures and at least one electrically insulating layer structure, a component provided in and/or on the stack, said component comprising at least one electrically conductive surface connected to an electrically conductive connecting element, said connecting element extending from said electrically conductive surface away from the stack and configured to be connected to at least one external component to be mounted on the component carrier when at least one connecting surface provided in/on the external component is faced to the electrically conductive surface of the component, wherein the connecting element is made of a heterogeneous conductive structure that is arranged to permanently compensate for a relative movement between said electrically conductive surface of the component and said connecting surface of the external component. Also provided is a package using such component carrier.

22 Claims, 6 Drawing Sheets

(56) References Cited

U.S. PATENT DOCUMENTS

| | | | | |
|---|---|---|---|---|
| 2015/0163921 | A1* | 6/2015 | Oster | H05K 1/0393 29/841 |
| 2021/0376564 | A1* | 12/2021 | Imahigashi | G01S 7/4815 |
| 2022/0199574 | A1* | 6/2022 | Karhade | H10W 70/611 |
| 2022/0200183 | A1 | 6/2022 | Nekkanty et al. | |

FOREIGN PATENT DOCUMENTS

| | | | | |
|---|---|---|---|---|
| CN | 114582744 | A | 6/2022 | |
| KR | 102375410 | B1 * | 3/2022 | B23K 35/025 |

* cited by examiner

COMPONENT CARRIER

This application claims priority to European Application No. EP 23194160.0, filed Aug. 30, 2023, which is incorporated herein by reference in its entirety.

TECHNICAL FIELD

The invention concerns electronic component carriers and electric component carrier package.

BACKGROUND

The invention relates to component carriers comprising a stack comprising a plurality of electrically conductive layer structures and at least one electrically insulating layer structure, a component provided in and/or on the stack, said component comprising at least one electrically conductive surface, e.g. in form of pads to establish an electrical connection, connected to an electrically conductive connecting element, said connecting element extending from said electrically conductive surface away from the stack and configured to be connected to an external component to be mounted on the component carrier when at least one connecting surface provided in/on the external component is faced to the electrically conductive surface of the component.

A package as the basis for the present invention can comprise a stack comprising a plurality of electrically conductive layer structures and at least one electrically insulating layer structure, a component provided in and/or on the stack, said component comprising at least one electrically conductive surface, and at least one external component, said external component comprising at least one connecting surface. Said component and said at least one external component are electrically connected one to each other, in particular with the at least one electrically conductive surface of the component and the at least one connecting surface of the external component facing each other, by at least one connecting element.

The connection between the carrier or package and an external component can be achieved for instance as proposed in CN 114334682 A by nanowires provided on two opposed lands of two packages structures (i.e. flip chip on a substrate) and a conductive intermediate material.

The CN 114582744 A, too, discloses connection features of chip packaging through nanowires provided on pillars placed one opposite to each other.

On other kinds of carriers or packages, at least one external component can be mounted or provided on/in the carrier and connected with a further component in electrically conducting manner directly or indirectly. The measures for ensuring a safe connection during manufacture and in use under changing ambient conditions, in particular under changing temperature conditions with different expansion of the different connected components are very complicate and expensive. In spite of all this effort, the known arrangements provided on a component carrier, directly or indirectly connected to a further component, causes quality and reliability troubles relating to the alignment in all orthogonal directions between the components and the component carrier and between the component connections. In particular, the CTE (coefficient of thermal expansion) mismatch among the components and with respect to the carrier at the location where one component is mounted leads to mechanical stress on the connection between the carrier and the component and between the components as well; in the exemplary embodiment in which the component provided in and/or on the stack is a bridge connected to at least two external components, the CTE (coefficient of thermal expansion) mismatch between the bridge and the carrier at the location where one or two of the external components are assembled causes an heterogeneous expansion/displacement of the connecting areas (i.e. the electrically conductive surfaces of the bridge, the connecting surfaces of the external components and the other areas on the carrier where the external components are connected), negatively impacting on the stresses of the connections between the external components and the bridge as well as between said external components and the carrier, improving the risk of breakage and/or failure of these connections during the assembly and/or in the assembled condition along the time.

SUMMARY

It is the object of the present invention to overcome the disadvantages of the prior art and to provide an improved component carrier and an improved package, that can in particular achieve a reliable and stable connection between the components and the component carrier irrespective of the environmental conditions and by a simple and cheap, though reliable, arrangement. Especially, the direct connection between components should be ameliorated, where at least one of the component is exposed to mechanical stress caused by the carrier having different physical properties (like CTE) where this component is mounted or integrated, in particular even for difficult arrangements, when the component is a bridge connecting two components or a component with one component and a carrier structure.

The scope of the present invention is as defined by the subject-matter of the independent claims. The dependent claims specify particular embodiments of the present invention.

To provide an enhanced component carrier the present invention proposes that the connecting element is made of a heterogeneous conductive structure that is arranged to permanently compensate for a relative movement of said electrically conductive surface of the component and said connecting surface of the external component with the component carrier. The term “permanently compensate for a relative movement between the two surfaces” means that during the assembly or in the assembled condition of said components, a mismatching of the alignment between the two surfaces, and/or different expansions rate during temperatures changing of the materials of the components and/or of the carrier structures carrying at least one of said components is compensated by the structural and/or intrinsic characteristics of said heterogeneous conductive structure, along the planar direction of the component carrier (along the x-y-direction) and/or along the component carrier thickness direction (along the z-direction). With an arrangement according to the invention it is possible to balance mechanical stress on the one hand side and compensate geometrical process-related differences (e.g. production-related inaccuracies) in the x-, y- and z-axes. Whereas the mechanical stresses can be caused by the CTE mismatching between the component, the external component and the stack where the component is provided (see above), the geometrical inaccuracy can happen for several reasons; for example, the component provided in and/or on the stack can be inclined (for example the planar extension of the component and/or the bottom/upper surface of the component is not parallel with respect to the planar main extension/one external surface of the stack) due to the fact that the electrically conductive layer structures distribution vertically below the component (along the component carrier thickness) is not constant, causing the inclination-tilting of the component, resulting in a misalignment of the components along the vertical direction (z-direction) of the component carrier. In particular, due a denser distribution of an electrically conductive layer structure (i.e. conductive traces, pads, etc.) in an area partially vertically overlapping the component, the abutting and adjacent electrically insulating layer structure material (i.e. dielectric material) accumulates in a different manner with respect to areas having a coarser distribution of the (respective) electrically conductive layer structure, resulting in surface supporting the component in a different manner in different areas, resulting in a tilted assembled component. From experimental tests, this effect is widely demonstrated when the electrically insulating layer structure comprises resin material, preferably with fillers distributed therein, more preferably comprising inorganic fillers/non fibrous fillers, in particular spherical fillers, and/or when the amount of the electrically conductive layer structure(s) (i.e. in terms of volume/weight per unit) below a portion vertically overlapping the component is higher than the respective amount of electrically conductive layer structures vertically overlapping a further portion of the same component; preferably, the resulting tilting of the component is between 0.05° and 10°. Due to the inclination of the component and/or the wrong assembly of the external component with the component, the external component (i.e. the lower surface and/or the planar main extension thereof) during and in the assembled condition can be preferably inclined with respect to the component where it is assembled; according to one embodiment, the component and the external component can result with a vertical distance difference from 0.1 to 10 μm between two opposed planar extremities. Additionally or alternatively, the misalignment between the component and the external component is preferably along the planar direction (x-y plane of the component carrier); said misalignment can occur due to the wrong placement of one component with respect to the other and/or due to the tolerances between the electrically conductive surfaces of the component and those of the connecting surfaces of the external component; this misalignment can occur during the assembly between the component and the further component or in the assembled (working) condition for example due to the temperature variations; this planar misalignment can be of a value between 0.1 to 10 μm along the planar (x-y) direction. The heterogeneous conductive structure according to the present invention is configured to compensate these kinds of the geometrical inaccuracy, especially within the above mentioned ranges.

An external component is to be understood as a second component that can be arranged on the component carrier but is separate from the layer structures of the component carrier before assembly. In the in-use (assembled) position of the component carrier the second (external) component is arranged to be connected preferably permanently electrically and/or mechanically to a first component arranged on the component carrier, which first component can be integrated in the layer structures of the component carrier.

Preferred, the connecting element is elastically or at least temporarily deformable, where the deformation is at least one of a compression, elongation, shearing or bending. In this way, a safe connection during assembly and during operation under changing ambient conditions, in particular under changing temperature conditions, also in the operational position can be guaranteed.

One first embodiment of the present invention is characterized in that the heterogeneous structure of the connecting element comprises a solid electrically conductive material with voids inside. This may bring the advantage of ensuring a reliable physical and electrical connection while reducing the mass of the component carrier, with the deformability provided by the heterogeneous structure of the connecting element itself.

Said voids can be advantageously contain a gas, in particular air, or can be at least partly evacuated, said voids being preferably at least partially connected one to each other defining air passages. This may bring the advantage of adjusting a physical property, for example the malleable/pliable ability of the heterogeneous structure.

Another embodiment according to the invention provides that the voids comprise a filler, said voids being preferably at least partially sealed one against each other. The filler can comprise or consist of a resin and/or an elastomeric material and/or a liquid. This may bring the advantage of having a diverse kind of materials to adjust the heterogeneous structures' property/behaviour. The filler could also be electrical conductive. The sealing between the voids has the advantage of leading to a different/more controllable deformability/elasticity of the connecting element due to fact that the filler, with specific deformability/elasticity properties, does not have the possibility to expand into other spaces other than that defined by the respective void. A conductive filler would be then fully justified, properly conjugating the deformability and the conductivity properties.

Another embodiment of the invention is characterized in that part of the voids are open to the outside of the solid material and thereby affect the external roughness and/or the size of the surface area of the connecting element. This may bring the advantage of ensuring a reliable connection to the heterogeneous structure (by other material, what could be the underfill to protect the heterogeneous structure from harsh environment), for example defining the deformability of the external portion of the connecting element through its rough/jagged external surface defined by the exposed voids.

A further embodiment of the invention can be characterized in that the heterogeneous structure comprises a plurality of electrically conductive nanowires spaced apart one to each other, connected to the electrically conductive surface and extending away from the stack. This may bring the advantage of enhancing the flexibility of the heterogeneous structure. Additionally, a redundant connection can be achieved, due to the fact that a plurality of nanowires leads to a reliable electrical connection even in case of breakage of few of those nanowires.

Preferred, each of said plurality of nanowires is connected to and/or bonded to and/or monolithically merged from the electrically conductive surface. This may bring the advantage of providing a reliable connection, while still having flexible (physical) properties.

A still further embodiment of the invention in characterized in that the heterogeneous structure comprises an electrically conductive porous material connected to the electrically conductive surface. This may bring the advantage of enlarging the surface area of the heterogeneous structure and thus ensuring a reliable connection to the electrically conductive surface, said porosity defining the deformability of the of the connecting element assuring at the same time the proper conductivity features provided from the remaining conductive material.

According to a further embodiment of the invention, the heterogeneous structure can comprise a liquid metal structure connected to the electrically conductive surface. This may bring the advantage of high flexibility since liquids are known to be easy deformable substances.

Another embodiment of the present invention shows a heterogeneous structure which comprises a solder bump with rubber particles inside. This combination of (visco) elastic rubber with solder material may provide good physical and electrical connection while having flexible properties.

The component may be at least partially exposed outside the stack, providing an easy to manufacture way to establish a reliable connection. Preferred is an arrangement, wherein the stack comprises at least one exposed electrically conductive surface on the main surface where the component is exposed, said at least one exposed electrically conductive surface being connected to an external conductive structure extending from the at least one exposed electrically conductive surface and configured to expose a surface at a higher vertical level than that of the at least one exposed electrically conductive surface. This may bring the advantage of simplifying the connection process, while ensuring a reliable connection during operation, especially due to the fact that the external conductive structure can compensate the different heights, i.e. along the z direction, exemplarily caused by the presence of the connecting element, leading to an easier assembly of the external component or other components on a more planar/constant surface/level.

Most preferred, according to a further embodiment, a damping structure is provided between the component and the stack. This allows a simpler and easier to manufacture arrangement compared to the know solution with a micro socket array having a complicate and expensive shape. Additionally, the damping structure imparts an additional possible eventual displacement of the component with respect to the component carrier, improving the mismatching compensation in terms of CTE and tolerances.

According to a further embodiment of the invention, the component is at least partially embedded in the stack, in particular exposing only at least a portion of the connecting element. This may bring the advantage of providing mechanical protection to at least two (side) walls, while offering exposed connection elements to be connected.

According to a still further embodiment of the invention the component is configured to be connected to at least two external components, in particular with the component providing a bridge function. This can increase the flexibility of the design of the component carrier. In particular, the bridge function may provide a short local distance, which enables fast signal transmission between the respective at least two components, e.g. between a HBM (high bandwidth memory) and a processing component (CPU, GPU, etc.) or to establish a fast communication between chiplets. All quality and reliability troubles relating to the alignment in all orthogonal directions between the component with the bridge functionality and the external components and/or CTE (coefficient of thermal expansion) mismatch between the bridge and the connected components, in particular mechanical stress on the connections (see above), can be omitted and a reliable and stable connection between the external components and the component with the bridge function can be achieved irrespective of the environmental conditions and by a simple and cheap, though reliable, arrangement; additionally and/or alternatively, in case the stack exhibits a non-planar external surface (for example due to the fact that said external surface comprises an electrically insulating layer structure with resin material, preferably with fillers distributed therein, more preferably inorganic fillers/non fibrous fillers in particular spherical fillers), the external component can be assembled on the bridge on one side, and on the non-planar surface of the stack on the other side, assuming a position inclined with respect to the component carrier planar extension; the inclination can be unpredictable and/or can be improved due to an eventual inclination of the bridge itself (see above). Any mismatching of the alignment between the contacting surfaces on the bridge and the external components, respectively, and/or different expansions rate during temperatures changing of the materials is compensated by the structural and/or intrinsic characteristics of said heterogeneous conductive structures connecting the bridge component with the external components, along the planar direction of the component carrier (along the x-y-direction) and/or along the component carrier thickness direction (along the z-direction).

The present invention as explained in the preceding paragraphs can overcome the disadvantages of the prior art by a connection where the damping effect is obtained by the dimensions (nanowires) and/or the materials (other alternatives) of the contacting protruding elements.

The objects of the present application can also be achieved by a package, which is characterized in that the connecting element is made of a heterogeneous conductive structure that is arranged to permanently compensate for a relative movement of said electrically conductive surface of the component and said connecting surface of the external component with the component carrier. The term "permanently compensate for a relative movement between the two surfaces" means that during the assembly or in the assembled condition of said components, a mismatching of the alignment between the two surfaces, and/or different expansions rate during temperatures changing of the materials of the components and/or of the carrier structures carrying at least one of said components is compensated by the structural and/or intrinsic characteristics of said heterogeneous conductive structure, along the planar direction of the component carrier (along the x-y-direction) and/or along the component carrier thickness direction (along the z-direction).

Preferred, the connecting element is elastically or at least temporarily deformable, where the deformation is at least one of a compression, elongation, shearing or bending. In this way, a safe connection during manufacture and in use under changing ambient conditions, in particular under changing temperature conditions, can be guaranteed.

According to a first embodiment of the package according to the invention, the heterogeneous structure of the connecting element comprises a solid electrically conductive material with voids inside. This may bring the advantage of ensuring a reliable physical and electrical connection while reducing the mass of the component carrier and therefore also of the package as a whole, with the deformability provided by the heterogeneous structure of the connecting element itself.

Advantageously, the voids of the component carrier within the package can contain gas, in particular air, or are at least partly evacuated, in particular said voids being preferably at least partially connected one to each other defining air passages. This may bring the advantage of adjusting a physical property, for example the malleable/pliable ability of the heterogeneous structure.

Another embodiment is characterized in that the voids of the component carrier within the package comprise a filler, in particular said voids being preferably at least partially scaled one to against each other. The filler can comprise or consist of a resin and/or an elastomeric material and/or a liquid. This may bring the advantage of having a diverse tool of materials to adjust the heterogeneous structures' property/behaviour.

Another embodiment of the invention is characterized in that part of the voids of the component carrier within the package are open to the outside of the solid material and thereby affect the external roughness and/or the size of the surface area of the connecting element. This may bring the advantage of ensuring a reliable connection to the heterogeneous structure (by other material), for example defining the deformability of the external portion of the connecting element through its rough/jagged external surface defined by the exposed voids.

A still further embodiment of the invention is characterized in that the heterogeneous structure of the package comprises a plurality of electrically conductive nanowires distanced spaced apart one to each other, connected to the electrically conductive surface and extended extending away from the stack. This may bring the advantage of enhancing the flexibility of the heterogeneous structure. Additionally, a redundant connection can be achieved, due to the fact that a plurality of nanowires leads to a reliable electrical connection even in case of breakage of few of those nanowires.

In this embodiment it is of advantage, if each of said plurality of nanowires in the package are each is connected to and/or bonded to and/or monolithically merged from the electrically conductive surface. This may bring the advantage of providing a reliable connection, while still having flexible (physical) properties.

A still further embodiment of the invention is characterized in that the heterogeneous structure of the package comprises an electrically conductive porous material connected to the electrically conductive surface. This may bring the advantage of enlarging the surface area of the heterogeneous structure and thus ensuring a reliable connection to the electrically conductive surface, said porosity defining the deformability of the of the connecting element assuring at the same time the proper conductivity features provided from the remaining conductive material.

A still further embodiment of the invention provides a heterogeneous structure within the package that comprises a liquid metal structure connected to the electrically conductive surface. This may bring the advantage of high flexibility since liquids are known to be easy deformable substances.

Another embodiment of the invention is characterized in that the heterogeneous structure of the package comprises a solder bump with rubber particles inside. This combination of (visco) elastic rubber with solder material may provide good physical and electrical connection while having flexible properties.

According to the present invention, a further embodiment of a package is characterized in that the connecting element comprises two elements, a first element connected to the at least one electrically conductive surface and a second element connected to the at least one connecting surface, said two elements being connected one to each other providing the electrical connection between the at least one electrically conductive surface of the component with the at least one connecting surface of the external component. This may bring the advantage of creating a connection between two respective components, which is able to compensate relative movement between the components during or after the manufacturing process. Moreover, the compensation is distributed to two elements, relaxing the eventual (mechanical) stresses deriving from the use of one element only.

Preferred, the two elements in this package are connected one to each other through their mutual frontal contact, preferably, said frontal contact is provided by the extremity of each element opposed to the extremity in contact/associated with the at least one electrically conductive surface of the component or the at least one connecting surface of the external component. For frontal contact it is meant as provided along the stack thickness and/or the mounting direction of the component and the external component; the frontal contact may result in a deformation of the two elements at the portion of the contact (such us the deformation of the nanowires or the porous portion comprised in the conductive elements) due to the decrease of the distance between the component and the external component during/after their connection; according to a preferred embodiment of the present invention, the frontal contact may result in the partial insertion of one of the two elements inside the opposed element and vice versa (for example, nano wires comprised in one element are inserted in the spaces between the nano wires comprised in the opposed element).

According to an embodiment, the mutual frontal connection would involve only a partial (frontal) portion/surface of the involved element (i.e. only a portion of the nanowires comprised in one of the two elements interacts with the opposed connecting element or only a portion of the porous material interacts of the opposed element). This may bring the advantage of ensuring a highly reliable connection during and after the manufacturing process even in case of not completely aligned elements and/or different heights of associated couples of said elements (due for example by the vertical misalignment of the component and/or the external component), respectively.

Another embodiment according to the invention is characterized in that the two elements in this package are connected one to each other by the at least partial intertangle of the nanowires of the first element with the nanowires of the second element. This may bring the advantage of ensuring permanent connection between the respective components.

A still further embodiment is characterized in that within the package the connecting element and/or the first element and/or the second element is deformed at the contact portion with the respective at least one electrically conductive surface or at least one connecting surface or the opposing first or second element. This may bring the advantage of ensuring physical and/or electrical connection without breakage due to deformation, maintaining at the same time a stiff and compact structure of the remaining connecting element.

Preferred, the at least one electrically conductive surface of the component and the at least one connecting surface of the external component within the package are solely connected one to each other by the connecting element. This may keep the lateral distance between the components short and ensures fast data or current connection.

Further preferred, the connecting element and/or the first element and/or the second element within the package are at least partially covered by a protecting material. This may enhance the long-life performance since the components are shielded from environment.

A further embodiment of the invention is characterized in that an underfill structure is provided within the package between the component and the external component. This may bring the advantage of protecting the connection from the environment, for example, oxidation by air.

Another embodiment according to the invention is characterized in that the stack within the package comprises at least one exposed electrically conductive surface on the main surface where the component is exposed, said at least one exposed electrical conductive surface being connected to an external conductive structure extending from the at least one exposed electrical conductive surface and configured to expose a surface at an higher vertical level than that of the at least one exposed electrical conductive surface. This may bring the advantage of ensuring a reliable physical or electrical connection even at different levels in stack thickness direction.

Preferred, a damping structure is provided between the component and the stack in the package. This may further compensate for a relative movement between the component and the stack and may strengthen the integrity of the package.

Further, an arrangement of the package is of advantage, wherein the component is at least partially embedded in the stack, in particular exposing only at least a portion of the connecting element. This may bring the advantage of providing mechanical protection to at least two (side) walls, while offering exposed connection elements to be connected.

The component within the package is preferred configured to be connected to at least two external components, and most preferred it can have a bridge function. This can increase the flexibility of the design of the component carrier. In particular, the bridge function may provide a short local distance, which enables fast signal transmission between the respective at least two components. All quality and reliability troubles relating to the alignment in all orthogonal directions between the component with the bridge functionality and the external components and/or CTE (coefficient of thermal expansion) mismatch between the bridge and the connected components, in particular mechanical stress on the connections, can be omitted and a reliable and stable connection between the external components and the component with the bridge function can be achieved irrespective of the environmental conditions and by a simple and cheap, though reliable, arrangement. Also the CTE mismatch by the surrounding component carrier and the components causes a lot of mechanical stress. Due to the placement of component directly on or in the component carrier, this component is exposed to another mechanical stress level than the external components, what is compensated according the invention by the conductive connection element. Any mismatching of the alignment between the contacting surfaces on the bridge and the external components, respectively, and/or different expansions rate during temperatures changing of the materials is compensated by the structural and/or intrinsic characteristics of said heterogeneous conductive structures connecting the bridge component with the external components, along the planar direction of the component carrier (along the x-y-direction) and/or along the component carrier thickness direction (along the z-direction).

The component carrier can further be configured as one of the group consisting of a printed circuit board, and a substrate (in particular an IC substrate). In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of metal, for example copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

The at least one electrically insulating layer structure can comprise at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

The at least one electrically conductive layer structure may comprise at least one of the group consisting of copper, aluminum, nickel, silver, gold, palladium, and tungsten. Although copper is usually preferred, other materials or coated versions thereof are possible as well, in particular coated with supra-conductive material such as graphene. The conductive layer may form electrical or electronical components, conductive traces, vias or the like.

The at least one component can be selected from a group consisting of e.g. an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a soft magnetic element, in particular a ferromagnetic element, an antiferromagnetic element or a ferrimagnetic element, for instance a ferrite core or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked, in particular parallel stacked, and connected together by applying a pressing force, if desired accompanied by heat. The component carrier may be configured to carry further electric and/or electronic components, such as resistances, capacitors, diodes, transistors, or integrated circuits.

In the context of the present application, the term "liquid metal structure" may particularly denote any arrangement or composition being metal-based and being liquid or paste-like at or near the temperature of use of the component, arrangement or apparatus in which the liquid metal structure is utilized. For instance, mercury is a stable liquid elemental metal at room temperature, while Caesium, Gallium and Rubidium have melting points slightly above room temperature. Other than that, eutectic alloys could be utilized, with an alloy melting point lower than the melting points of any of the constituent metals. Such alloys can be mercury-based or gallium-based. If need may be, deformable shells around liquid or paste-like metal structures could be provided.

In the context of the present application, the term "main surface" of a body may particularly denote one of two largest opposing surfaces of the body or outermost opposing surfaces of the body. The main surfaces may be connected by circumferential side walls. The thickness of a body may be defined by the distance between the two opposing main surfaces.

In the context of the present application, the term "heterogenous structure" may particularly denote a structure composed of distinguishable portions composed of different materials, eventually in different state of aggregation (solid, liquid, gaseous), resulting in a heterogeneous physical body.

BRIEF DESCRIPTION OF THE DRAWINGS

Embodiments of the present invention are now described with reference to the accompanying drawings. The invention is not limited to the illustrated or described embodiments.

DETAILED DESCRIPTION OF EMBODIMENTS OF THE PRESENT INVENTION

Figure 1:
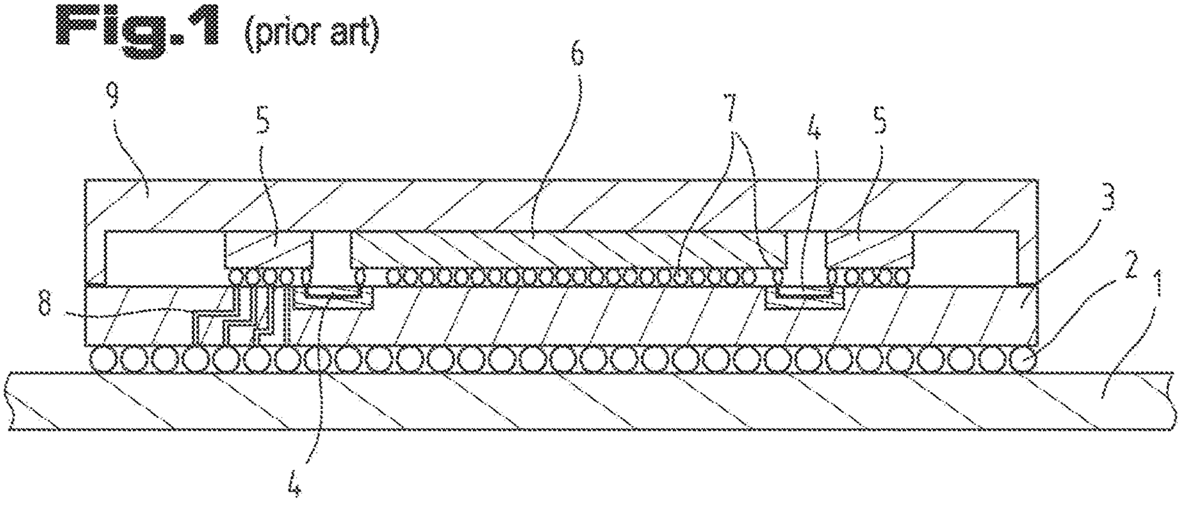
Fig.1 (prior art)
FIG. 1 Shows a prior art arrangement

FIG. 1 shows a package according to the prior art. A circuit board 1 is provided with solder balls 2 on one of its surfaces. A package substrate 3 is mounted on and electrically connected by the solder balls 2 and provides two recesses, in which bridges 4 are counter-sunk and positioned for electrically connecting top mounted components. These bridges 4 are in principle tiny pieces of silicon with ultra-high routing layers that connect for instance the transceiver dies 5 and at least one further chip 6 to another, for instance in the IC package. The electrically conductive connections are achieved by solder bumps 7. Standard package traces 8 are provided in the package substrate 3 and a package lid 9 covers and protects the above-mentioned elements.

Figure 2:
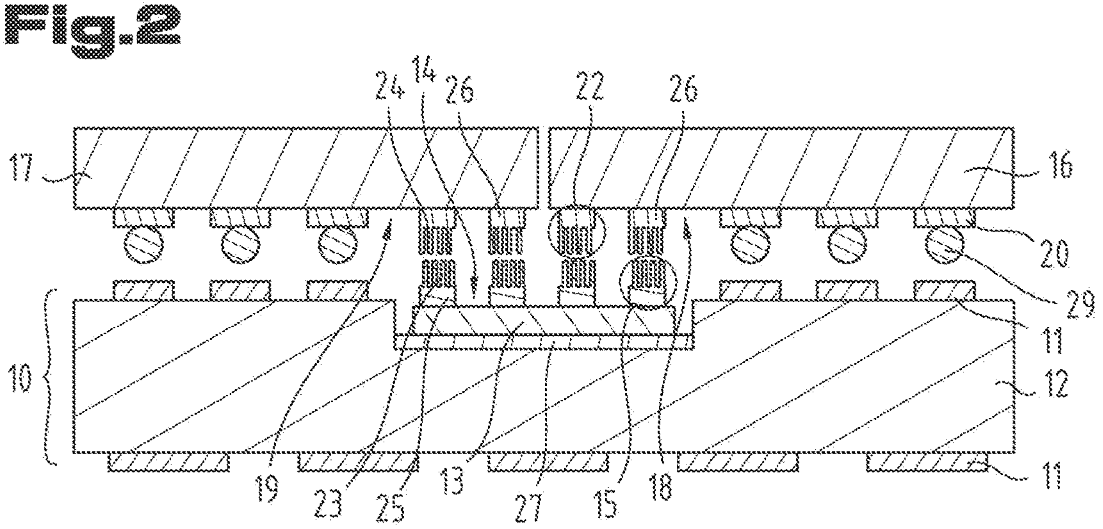
FIG. 2 Shows a schematic side view of a first embodiment of a package with a component carrier according to the invention FIG. 3 Shows a schematic side view of a second embodiment of a package with a component carrier according to the invention FIG. 4 Shows a schematic side view of a third embodiment of a package with a component carrier according to the invention FIG. 5 Shows a schematic side view of a fourth embodiment of a package with a component carrier according to the invention FIG. 6 Shows a schematic side view of a fifth embodiment of a package with a component carrier according to the invention FIG. 7 Shows a schematic side view of a sixth embodiment of a package with a component carrier according to the invention FIG. 8 Shows a schematic side view of a seventh embodiment of a package with a component carrier according to the invention FIG. 9 Shows a schematic side view of an eighth embodiment of a package with a component carrier according to the invention FIG. 10 Shows a schematic side view of a ninth embodiment of a package with a component carrier according to the invention FIG. 11 Shows a schematic side view of a tenth embodiment of a package with a component carrier according to the invention FIG. 12 Shows a schematic side view of an eleventh embodiment of a package with a component carrier according to the invention FIG. 13 Shows a schematic side view of an embodiment similar to FIG. 12, with an external component tilted with respect to the component carrier FIG. 14 Shows a schematic view of an embodiment similar to FIG. 3, with an external component misaligned with respect to the component carrier in x- and/or y-direction FIG. 15 Shows a schematic view of an embodiment similar to FIG. 4, with an encapsulant not completely filling a recess in the component carrier FIG. 16 Shows a microscopic picture of intertangled nanowires

The invention proposes now a newly designed component carrier, a first embodiment of which is shown schematically in FIG. 2. This component carrier comprises a stack 10 comprising a plurality of electrically conductive layer structures 11 and at least one electrically insulating layer structure 12. The plurality of electrically conductive structures may be electrically connected by common means like laser or mechanical vias (not shown). Further, a component 13 is provided in a recess in the stack 10 and/or on the surface of the stack 10, in particular on the surface of the insulating layer structure 12. In this example, the electrically insulating layer structure 12 is located/sandwiched between two electrically conductive layer structures 11, in particular having direct contact with each of the two electrically conductive layer structures 11.

Figure 5:
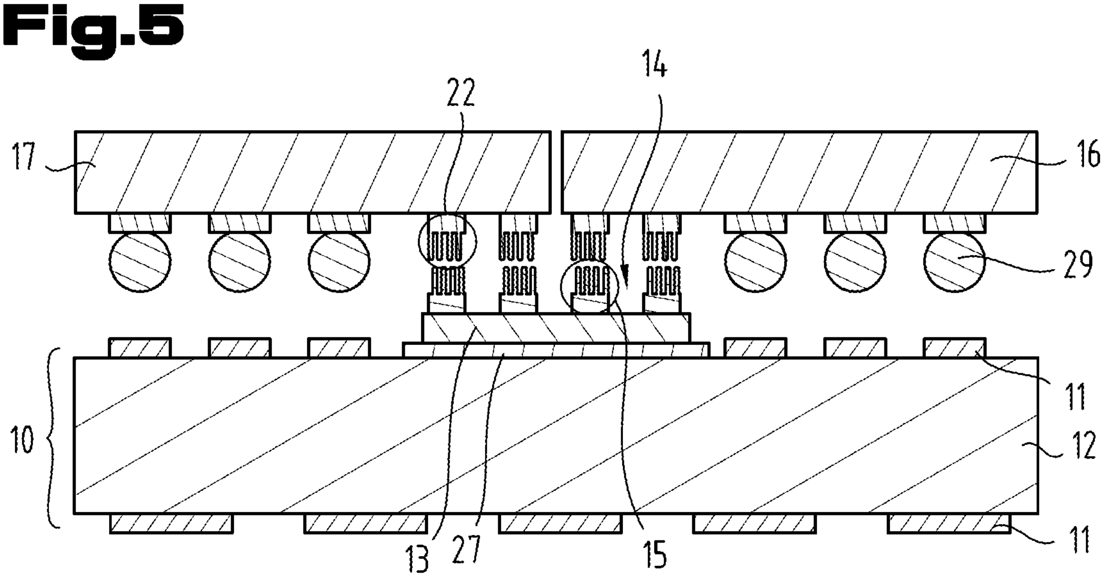
Figure 6:
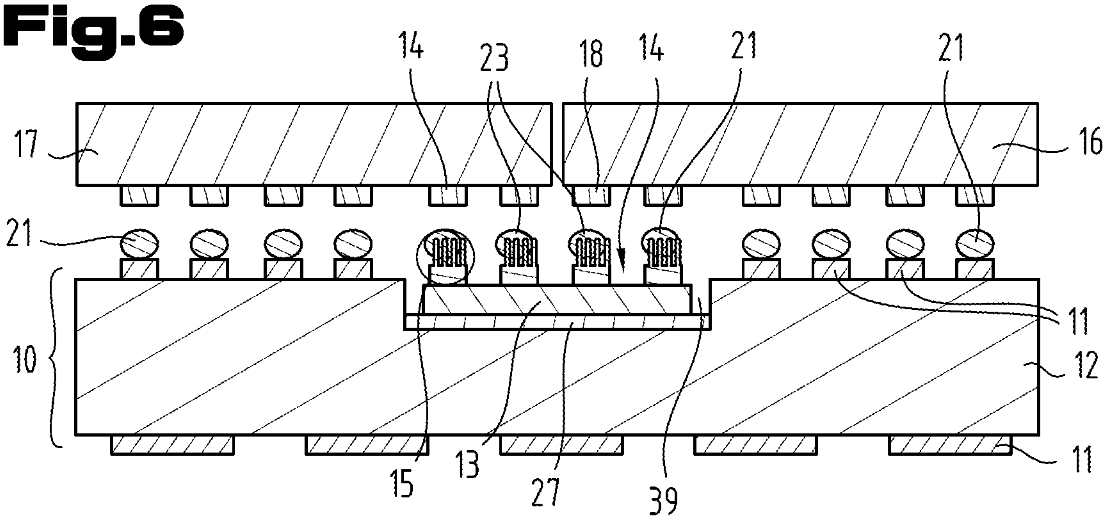

The component 13 comprises at least one electrically conductive surface 14, e.g. a pad or any other electrically conductive surface portion of the component 13, connected to an electrically conductive connecting element 15, which is extending from said electrically conductive surface 14 away from the stack 10, i.e. away also from the surface of the electrically insulating layer structure 12. Said electrically conductive surface 14 may be a portion of a wider conductive surface or may be a pad, optionally with a metal bump connected to said pad. In this example, the component 13 is located such, that the exposed surface of the component 13, which in the embodiment of FIG. 5 and FIG. 6, is the electrically conductive surface 14, is not on the same level regarding stack thickness direction compared with the exposed surface of the stack 10, which exposed surface is defined by the level of the conductive layer structures 11. In particular, the exposed surface of the component 13 is intended below the level regarding stack thickness direction of the exposed surface stack. Alternatively, the exposed surface of the component 13 is on the same level as the exposed surface of the stack 10 or protruding out of the exposed surface of the stack regarding stack thickness direction.

The connecting element 15 is configured to be connected to an external component 16, 17 to be mounted on the component carrier when at least one connecting surface 18, 19 provided in/on the external component 16, 17 is faced to the electrically conductive surface 14 of the component 13. In this position, electrically conductive structures 20 on the external components 16, 17 will also face the surface of the stack 10, in particular its electrically conductive layer structure 11. Structures 20 and structure 11 can be electrically connected by soldering, sintering, connection via a metal (copper pillar) or in any other suitable manner, symbolized in FIG. 2 by the solder bumps 29. As a (not shown) alternative, a solder material is also provided in the connecting element 15 in order to further strengthen the electrical connection.

As "facing the at least one connecting surface 18, 19 provided in/on the external component 16, 17 to the electrically conductive surface 14 of the component 13" it is meant that the two surfaces are at least partially overlapped from a frontal view perpendicular to one of the main surfaces of the component carrier, meaning that along the stack thickness direction (z-direction) a portion, preferably the majority, of the two surfaces overlaps one to each other; in other words, at least a portion between the at least one connecting surface 18, 19 provided in/on the external component 16, 17 and the electrically conductive surface 14 of the component 13 are aligned along the thickness direction of the stack (z-direction) so that they can be electrically connected by the electrically conductive connecting element, the latter preferably extending along a vertical direction (perpendicular to one of the main surfaces of the component carrier). In addition, the external components 16, 17 may have connection pads or other electrically conducting structures on their sides other than that facing the component 13 or the stack 10, respectively, e.g. on the opposite site of the connecting surface.

After accomplishing the electrical and also mechanical connection between the stack 10 and the external components 16, 17, a package comprising these elements 10, 16, 17 is at least partially formed. The final package might also have a heat removal structure on top of the external components (not shown). Most preferred, the explanations above and in the following, referring to the electrical connection elements 15 and their specific construction and design also apply to the connection elements 22 of the external components 16, 17.

It should be mentioned that FIGS. 2 to 10, 14 and 15 show—for the sake of clarity of the graphical representation of all details, in particular for the connection portions of the connection elements—the package comprising the above-explained structures in partly "exploded" state, i.e. the connection elements 15, 22 not yet physically and electrically in contact.

As can also be gathered from FIG. 2, each connecting element 15 is made of a heterogeneous conductive structure that is arranged to permanently compensate for a relative movement of said electrically conductive surface 14 of the component 13 and said connecting surface 18, 19 of the external component 16, 17 with the stack 10 of the component carrier.

Alternatively, at least one connection element 15 is made of a heterogeneous conductive structure, while the rest can be standard solder balls. Also a mixture of different kinds of heterogeneous structures is possible, e.g. the group of connection elements 15 consisting of nano wires and porous structures, of solder balls with rubber particles and nanowires, and so forth.

With these features, a reliable connection of the component 13, preferably a bridge, with the external components 16, 17 can be assured even in case of slight planar misalignment (relaxed to x-y and/or to z-tolerances), also compensating for CTE (coefficient of thermal expansion) mismatching. Further, there is a direct connection between the component 13 of the stack 10 and the external component 16, 17, with no need to embed the component anymore. At least, solder material can be avoided and potentially increase of the ICS-to-chip interconnection reliability is possible, as well as redundant connection between component 13 and external components 16, 17.

The connecting element 15, 22 may be permanently or at least temporarily deformable, where the deformation is at least one of a compression, elongation, shearing or bending. According to a first group of preferred embodiments of the invention, depicted in FIGS. 2 to 6, this can be accomplished by a heterogeneous structure comprising a plurality of electrically conductive nanowires 23, 24 preferably spaced apart one to each other and extending away from the stack 10 or the external component 16, 17, respectively. The nanowires 23 of the component 13 are connected to the electrically conductive surface 14 by end discs 25, and the nanowires 24 of the external components 16, 17 are connected to the conducting surfaces 18, 19 of these external components 16, 17 by end discs 26. Other than in the above-explained manner, each of said plurality of nanowires 23, 24 can be connected to and/or bonded to and/or monolithically merged from the electrically conductive surface 14, 18, 19. Nanowires have the advantage of giving a redundant connection, assuring the electrical connection even if some nanowires are broken. The connection between the external components 16, 17 and the stack 10 itself, in particular to the electrically conductive structures 11, can be provided in known manner by solder balls 29.

Most preferred, a damping structure 27, for instance an insulating material, preferably comprising a spongy structure, is provided between the component 13 and the stack 10. This allows a damped displacement of the component 13 and the external components 16, 17 connected thereto with respect to the stack 1. There may be provided free space between the sidewalls of the component 13 and the stack 1. This may have the advantage that the damping structure 27 can expand into this free space and/or can compensate the alignment misalignment between the component, the external component(s) and the component carrier as above and/or within the values above described Alternatively no free space provided and the damping structure 27 internally compensates the stresses (pressure or shear).

Figure 3:
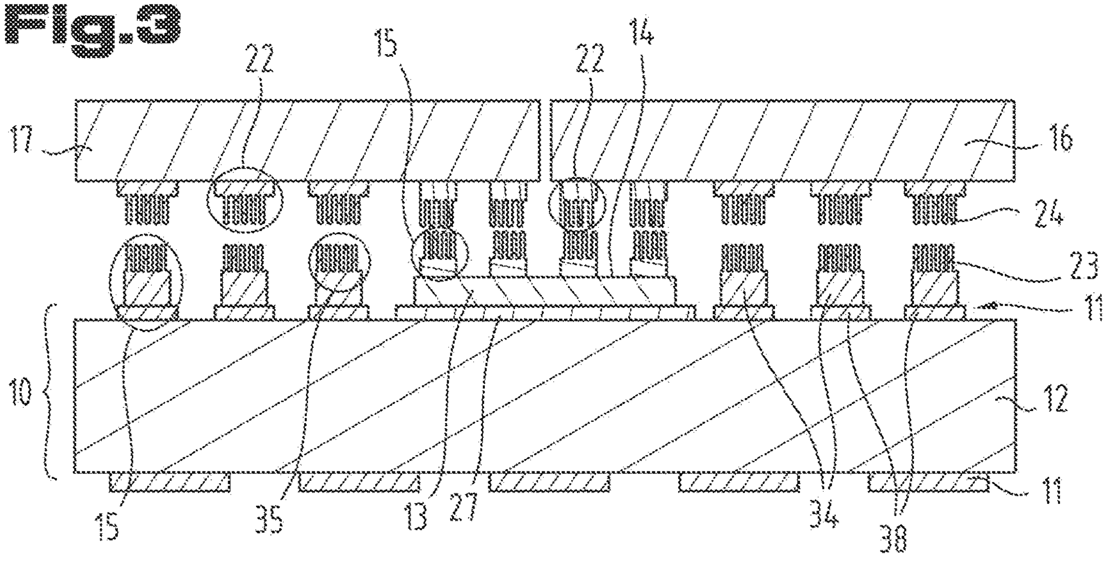

FIG. 3 shows a further embodiment of a stack respective a package according to the invention. While in the embodiment of FIG. 2 the component 13 is at least partially embedded in the stack 10, in particular exposing only at least a portion of the connecting element 15, the component 13 of FIG. 3 is at least partially exposed outside the stack 10.

FIG. 3 additionally shows that all electrical connections between the stack 10 and the external components 16, 17 could be realized by connection elements 15 and 22 comprising heterogenous structures 23, 24, respectively, with the most compensating arrangement possible. The front ends of the heterogenous structures, e.g. the nanowires 23 of the connecting elements 15 of the stack 10, can be at different levels along the stack thickness with respect to the connecting elements 15 of the component 13 of the stack 10, despite the fact that they could even be mounted on copper pillars 34, interposed between pads 38 and the nanowires 23 or any other heterogenous structure, like porous material, solder balls with rubber particles or the like. Other embodiments (not shown) provide ends of all connecting elements 15, 22 of the stack 10 and its component 13 arranged in one and the same plane along the stack thickness with the length of the copper pillars 34 compensating for all kinds of length differences of the heterogenous structures to create the same final level of the exposed extremities of e.g. the nanowires 23. As is understood, all of the above explanations regarding the length, build and positioning of the front ends of the connection elements apply in similar manner to the external components 16, 17.

Another possible embodiment regarding the arrangement of the component 13 with respect to the stack 10 is also shown in FIG. 3. In this possible arrangement, wherein the stack 10 comprises at least one exposed electrically conductive surface 11, 14 with e.g. a pillar structure like e.g. a copper pillar 34 on the main surface, where the component 13 is exposed, said at least one exposed electrically conductive surface being connected to an external conductive structure 22, 24 is at the same level in direction of the stack thickness than the electrically conducting surface structure of the component 13.

Figure 4:
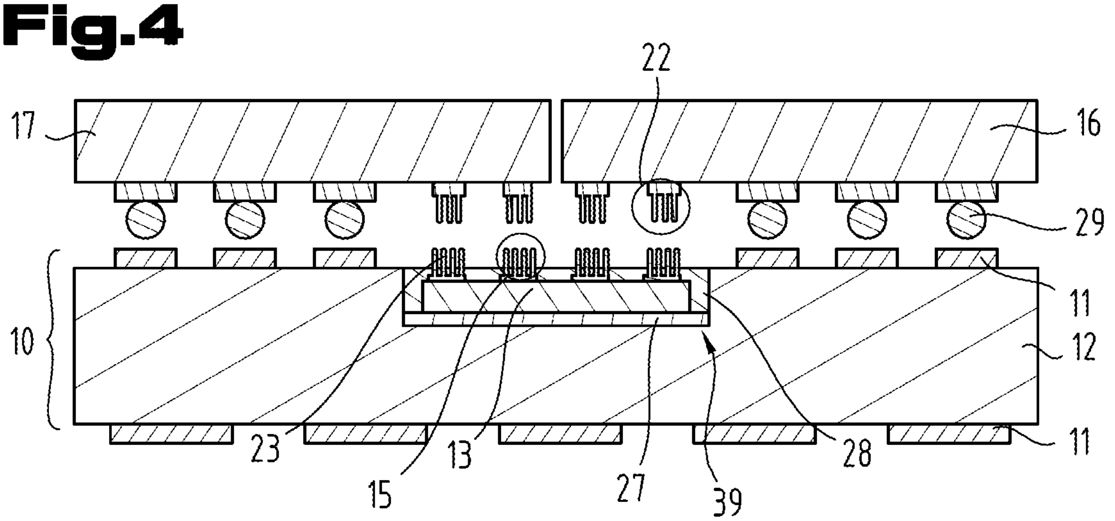

FIG. 4 shows a further embodiment, where the exposed sides of the component 13 are coated with an encapsulant 28 to protect the component 13. In the shown embodiment, the component 13 is inserted in a recess 39 provided in the stack 10. Accordingly, the encapsulant material 28 is provided in the recess 39 covering the component 13 and preferably also covering at least partially one surface of the connection elements 15. The material of the encapsulant 28 preferably fills the recess in the stack 10 completely, where the component 13 is inserted, with the upper surface of the encapsulant 28 preferably flushing with the one of the surfaces (preferably the external surface) of the surface of the electrically insulating structure 12 of the stack 10. Alternatively, the component may be only partially inserted in the recess or it can be externally provided with respect to the stack 10; depending of the position of the component with respect to the stack and the actual need to protect the (portions of the) component, the encapsulant may be exposed with respect to the stack 10 and/or may partially or fully fill the recess; in the preferred embodiment in which the encapsulant partially fills the recess, a step portion (see FIG. 15) corresponding to the edge of the recess may emerge from the encapsulant; according to this embodiment, the adhesion of an eventual dielectric material, such as an underfiller, is improved. The encapsulant 28 is preferably consisting of an electrically insulating material. Furthermore, it may comprise filler material. In an embodiment, the encapsulant 28 can also surround the contacting element, preferably abutting and/or at least partially penetrating to/into said contacting element; preferably, according to the shown embodiment of FIG. 4 the encapsulant material is in contact with the side walls of one extremity of at least an amount of the nano wires 23, in an extent depending of the nano wires dimensions and their distances as well as the encapsulant material properties, such as the viscosity in the liquid form. Alternatively the side walls of the nano wires may be free from encapsulant 28. Furthermore, the encapsulant 28 is preferably in direct contact with the damping structure 27 and both could be made of the same material, although in consideration of their different objectives different and task-optimized materials will be of advantage.

Below the damping structure 27 there could be provided an additional conductive structure (not shown) at the bottom of the recess in the electrically insulating structure 12 of the stack. Component 13 could also be electrically connected to such additional electrically conductive structure, which could be a copper layer.

Further, FIG. 4 shows that all other electrically conducting connections between the stack 10 and the external components 16, 17 can be provided by known solder connections, comprising solder bumps 29 between the conductive layer structure 11 of the stack 10 and the conductive layer structure 20 of the external components 16, 17. Again, other embodiments may be provided with at least one further connection structure between the components, as already explained above.

FIG. 5 shows the solution with solder bumps 29 even for an arrangement, where the component 13 is at least partially exposed and overtops the surface of the stack 10. As a further feature there may be a higher density of pads and/or smaller pad-size of the external components 16, 17 in the area of the component 13 forming a bridge for said external components 16, 17.

While the embodiments of FIGS. 2 to 5 all show the connecting elements each comprising two elements one at least partially frontally provided one to each other so that a mutual frontal contact is realized, FIG. 6 shows an embodiment where the connection elements 15 belonging to the stack 10 having the explained heterogenous structure are provided on one component only (such as the embodiments in FIG. 7); in other words, each connection element comprises one element only, interacting with a conductive surface of the opposed component during or after the connection of the two components; in the shown embodiment the nanowires 23, merging from the electrically conductive surface 14 of the component 13, abut in contact with for example pad-like connecting surfaces 18, 19 of the external components 16, 17.

Another possible embodiment regarding the arrangement of the component 13 with respect to the stack 10 is shown in FIG. 6. In this possible arrangement, wherein the stack 10 comprises at least one exposed electrically conductive surface 11 on the main surface of the electrically insulating structure 12 where the component 13 is exposed. The component 13 comprises at least one electrically conductive surface 14 facing the external components 16, 17 and connected to an electrically conductive connecting element 15, which is extending from said electrically conductive surface 14 away from the stack 1, i.e. away also from the surface of the electrically insulating layer structure 12. In this example, the component 13 is located such, that the exposed surface of the component 13, which in the embodiment of FIG. 5 and FIG. 6, is the electrically conductive surface 14, is not on the same level regarding stack thickness direction compared with the exposed surface of the stack 10, which exposed surface is defined by the level of the conductive layer structures 11. In particular, the exposed surface of the component 13 is intended below the level regarding stack thickness direction of the exposed surface stack. Alternatively, the exposed surface of the component 13 is on the same level as the exposed surface of the stack or protruding out of the exposed surface of the stack regarding stack thickness direction. Preferably, solder balls 21 might be placed within the heterogenous structure in order to further strengthen the connection between the stack 10 and the external components 16, 17.

Figure 7:
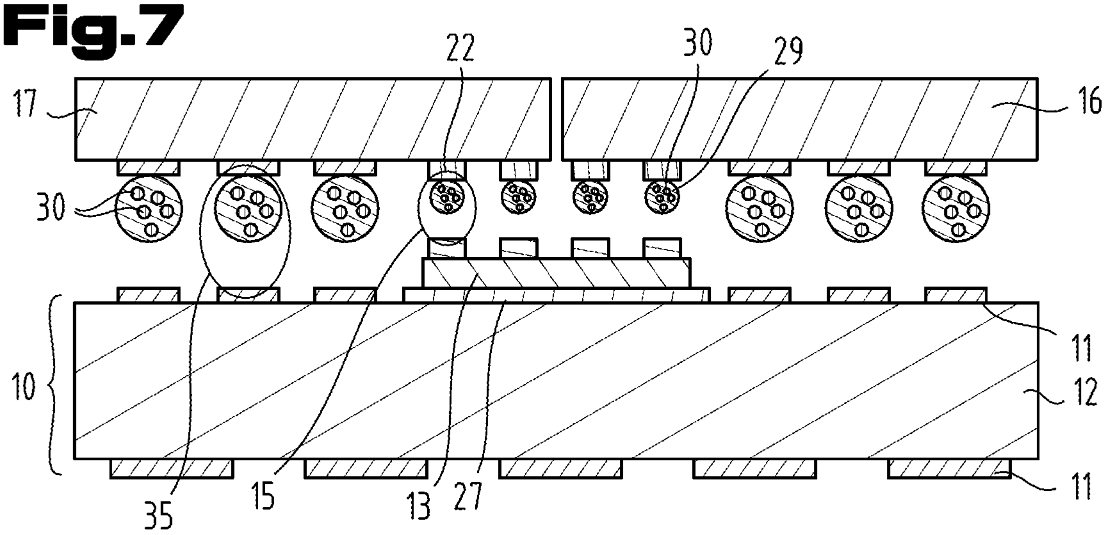

FIG. 7 shows a further embodiment of the invention, with a still further possible version of connection elements 15. These are built with a solid electrically conductive material, for instance solder bumps 29, with voids inside, which are filled preferably with rubber particles 30, which can be of equal size and/or preferably also of same size as the voids. Also, other fillers for the voids in the solid material are possible, comprising or consisting of a resin and/or an elastomeric material and/or a liquid. The voids are preferably at least partially sealed one against each other. Such voids within the metal might limit the conductivity (still compared to pure copper, not to solder). Other embodiments can provide voids containing a gas, in particular air, or can be at least partly evacuated, said voids being preferably at least partially connected one to each other defining air passages. In every case of filler or not, the voids or at least a part of them can be open to the outside of the solid material and thereby affect the external roughness and/or the size of the surface area of the connecting element 15, 22.

The solder bumps 29 can have different sizes for the connection elements 15 of the component 13 and for the connection elements 35 of the stack 10 itself, to compensate for possible thickness differences as for instance in the embodiment shown in FIG. 7, where the surface of the component 13 lies above the level of the electrically conducting structures 11 of the stack 10, seen in stack thickness direction. Alternatively, if such differences in height are compensated by e.g. pillar structures (like the copper pillars 34 shown in FIG. 3) all solder bumps 29 of the package of the elements 10, 16, 17 can have the same size. Same size for all solder bumps 29 is also possible for components 13 embedded in recesses of the upper surface of the stack 10, with all electrically conductive structures 11, 25 of stack 10 and component 13 arranged in the same plane seen in stack thickness direction.

Figure 8:
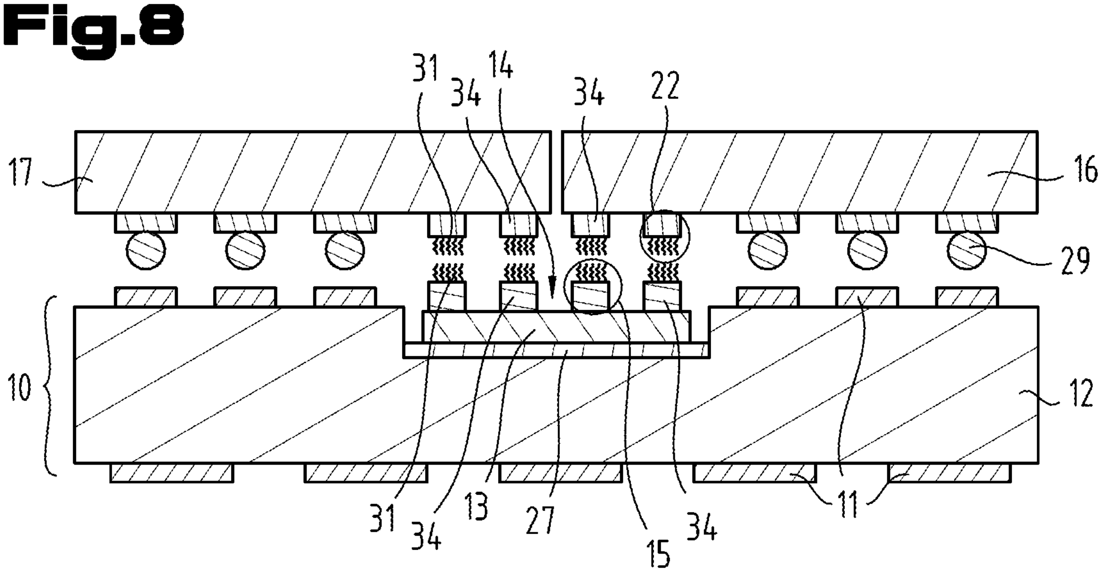
Figure 9:
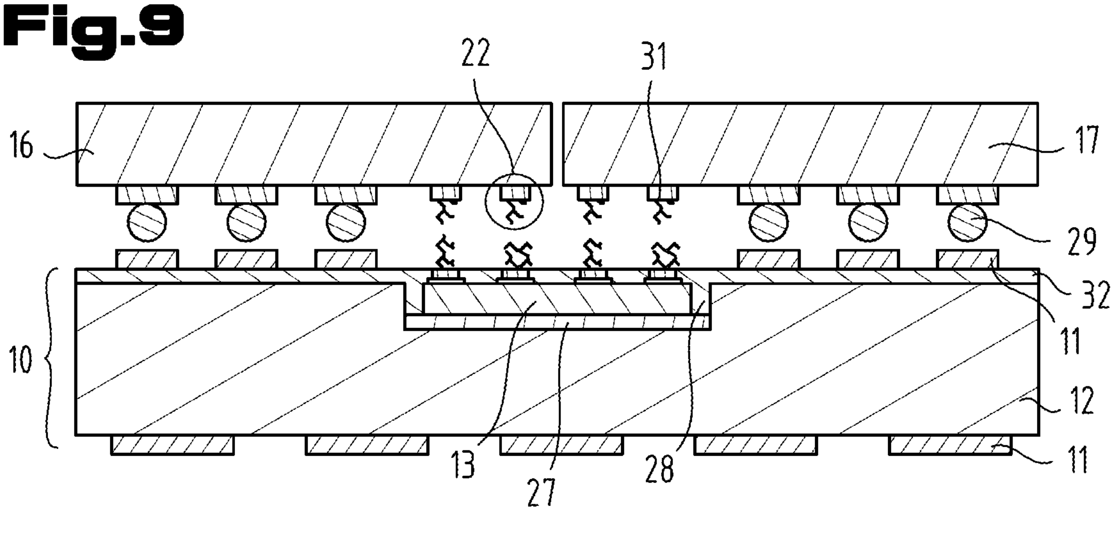
Figure 10:
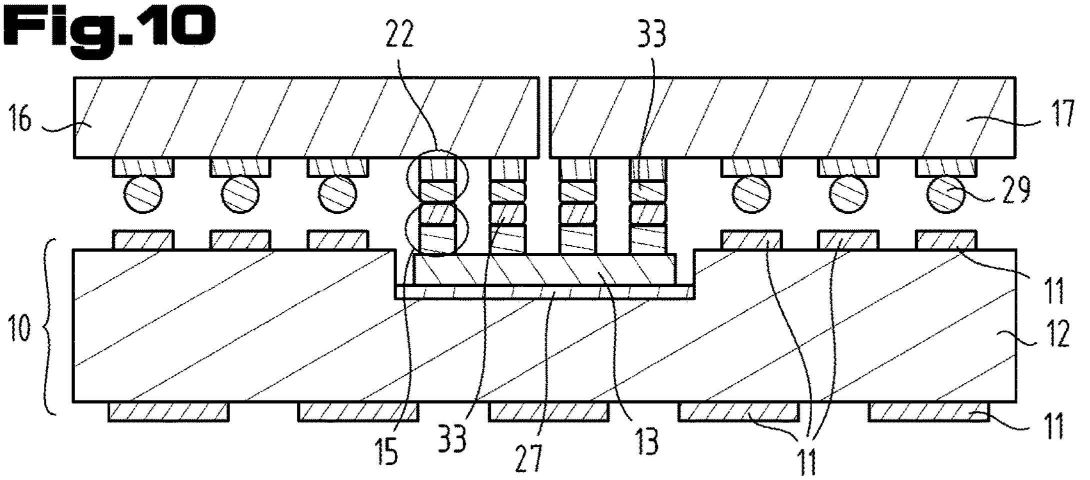

A still further embodiment of the invention is shown in FIG. 8, with the heterogeneous structure of the connection elements 15, 22 comprising an electrically conductive porous material 31 set on top of a copper pillar 34 and connected to the electrically conductive surface 14, e.g. a pad (not shown) or any other electrically conductive surface portion of the component 13. Such porous material 31 is also used in the embodiment of FIG. 9, where the porous material 31 is directly coupled to small pads on the surface of the component 13. In this embodiment, an extended version for a protection of the component 13 by an encapsulant material is shown. Not only the component 13 itself is covered and the recess in the stack 10 is filled by encapsulant material 28, but also at least part of the surface of stack 10, preferably the non-electrically conductive area of stack 10 is covered by a layer 32 of encapsulant material.

It must also be mentioned that the copper pillars 34 or every other pillar structure in every arrangement and on every component or layer structure may be embedded in the component 13 or any other component or layer structure.

This heterogeneous structure can comprise a liquid metal structure connected to the electrically conductive surface. As shown in the exemplary embodiment of FIG. 10, liquid metal portions 33 are set on top of copper pillars 34.

The present invention as explained in the preceding paragraphs can overcome the disadvantages of the prior art by a connection where the damping effect is obtained by the dimensions (nanowires) and/or the materials (other alternatives) of the contacting protruding elements.

As already resulting from the above description, the connecting element arrangement of a complete package 10, 16, 17 of a stack 10 of a component carrier and at least two external components 16, 17 comprises two further elements, a first element 15 connected to the at least one electrically conductive surface 14 of the component 13 and a second element 22 connected to the at least one connecting surface of the external components 16, 17, respectively. Said two elements 15, 22 being connected one to each other providing the electrical connection between the at least one electrically conductive surface 14 of the component 13 with the at least one connecting surface of the external component 16, 17. Preferred, the two elements 15, 22 are connected one to each other at their respective front-end sections, as can be best seen in FIG. 2.

Figure 16:
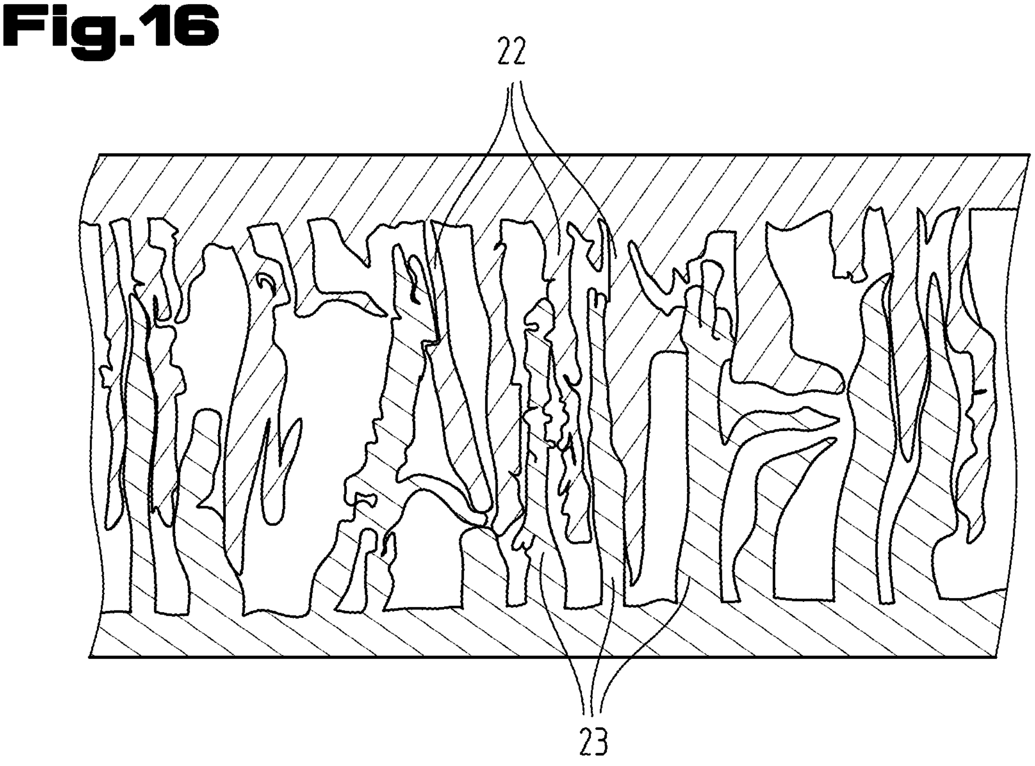

Another embodiment according to the invention comprises two elements 15, 22 that are connected one to each other by the at least partial intertangle of the nanowires 23 of the first element 15 with the nanowires 24 of the second element 22, as shown in the microscopic picture of FIG. 16.

A still further embodiment comprises a connecting element 15 and/or a first element and/or a second element that is deformed at the contact portion with the respective at least one electrically conductive surface 14, 18, 19 or at least one connecting surface or the opposing first or second element. Preferred, the at least one electrically conductive surface 14 of the component 13 and the at least one connecting surface 18, 19 of the external components 16, 17 are solely connected one to each other by the connecting element, 15, 22.

According to a further embodiment of the invention, the connecting element 15, 22 and/or the first element and/or the second element advantageously may at least be partially covered by a protecting material, and/or an underfill structure 36 can be provided between the component 13 and at least one of the external components 16, 17, preferably between the complete stack 10 and all external components 16, 17.

Figure 11:
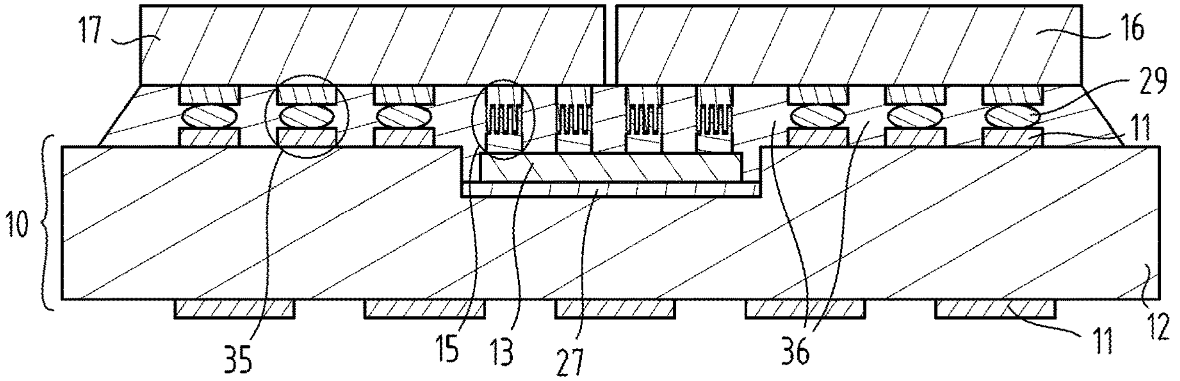

FIG. 11 shows in exemplary manner an embodiment with a package 10, 16, 17 comprising a complete underfill between the components.

Another embodiment according to the invention is characterized in that the stack comprises at least one exposed electrically conductive surface on the main surface where the component is exposed, said at least one exposed electrical conductive surface being connected to an external conductive structure extending from the at least one exposed electrical conductive surface and configured to expose a surface at an higher vertical level than that of the at least one exposed electrical conductive surface.

Figure 12:
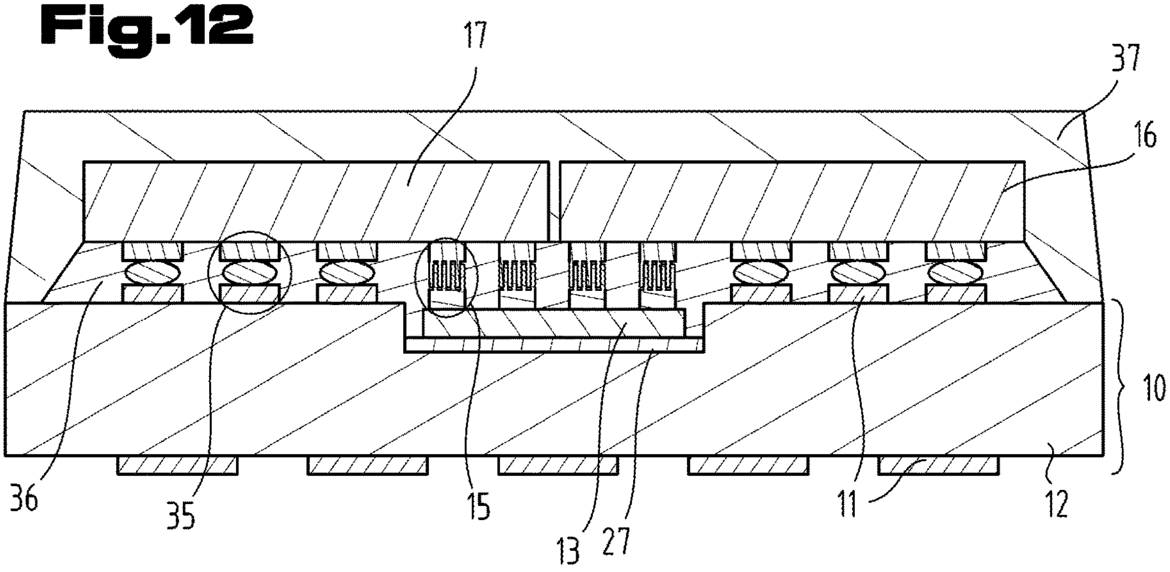

The package 10, 16, 17 may also be further protected by a top mounted rigid lid (not shown) at the side of the stack 10 with the external components 16, 17, or alternatively, by an overmould structure 37 as shown in FIG. 12. Said overmould structure 37 may be made from the same material as the underfill structure 36 and could be made as a unitary structure combining underfill structure 36 and overmould structure 37. A further embodiment could comprise a surface finish with a material like tin or gold or a solder resist, either as an alternative to the overmould structure 37 or a lid, respectively, or in combination therewith.

Figure 13:
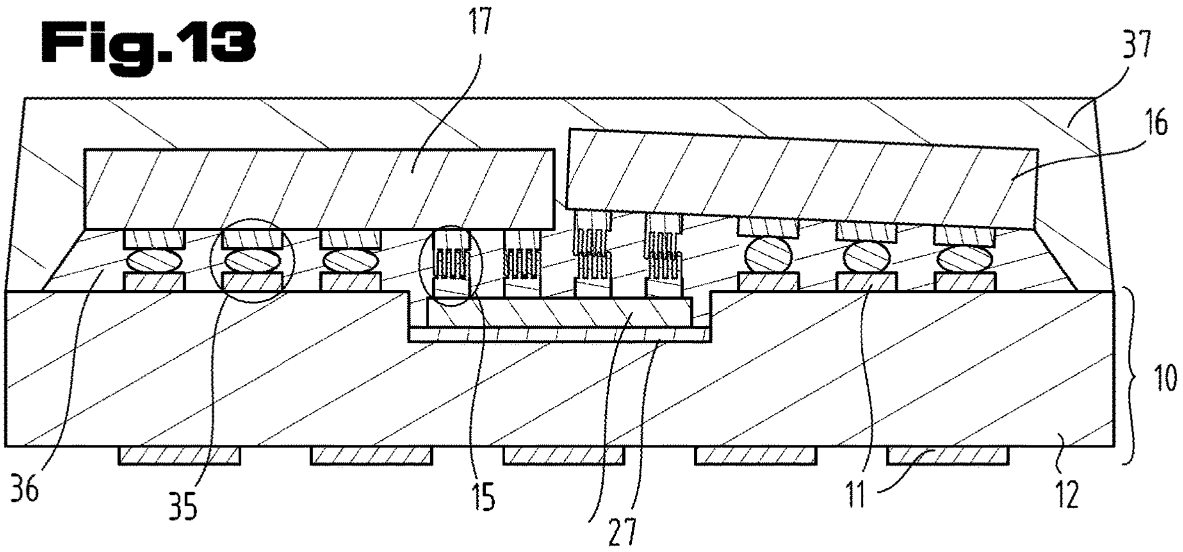

FIG. 13 shows an embodiment that even if similar to that of FIG. 12, according to the present invention it can represent an example of a package having a misalignment between the component 13 and the connected external component 16; in particular, the component 13 and the external component 16 may be misaligned one to each other along the vertical direction (z-direction) of the component carrier, preferably resulting in one component inclined with respect to the other, for example having the upper surface of the component 13 inclined (not parallel) with respect to the bottom surface of the external component 16 and/or having their overall planar extension inclined one to each other; in the shown embodiment in which the component 13 is connected with two external components 16, 17 (i.e. having a bridge function), the lateral extensions of the external components and/or of the their respective electrically conductive surface 14 and connecting surfaces 18, 19 can be inclined one to each other; for all of these kinds of misalignment, the connection between the component and the external component(s) can be affected during their assembly and/or in the assembly state (where for example this misalignment can occur or can increase due to example to different CTEs of the used material for the layers/components). The compensation of this misalignment is provided by the respective connecting elements 15 that due to the own heterogeneous structure allow the connection with the respective frontal portion and/or conductive surface even if misaligned one to each other and/or to compensate eventual movement among the components in the assembled (working) condition for example due to the temperature variations along the time.

Figure 14:
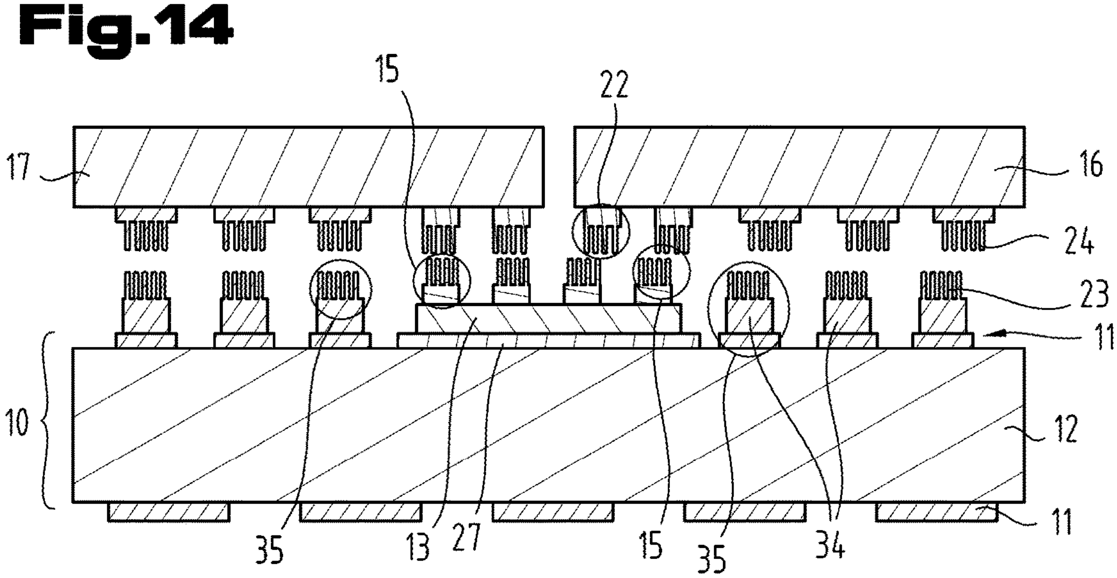

FIG. 14 shows a further kind of misalignment that in alternative or in addition to that shown in FIG. 13 can affect the connection between the component 13 with the external component(s) 16, 17 and/or can affect the respective integrity: the misalignment is preferably along the planar direction (x-y plane of the component carrier). Said misalignment can occur due to the wrong placement of one component with respect to the other and/or due to the tolerances between the electrically conductive surfaces 14 of the component and those of the connecting surfaces 18, 19 of the external component(s); this misalignment can occur during the assembly between the component 13 and the further component(s) 16, 17 or in the assembled (working) condition for example due to the temperature variations Such misalignment can very effectively be compensated with connecting elements 15, 22, 35 having at least one of the disclosed heterogeneous structure, for example the shown nanowires 23, 24 allowing the connection of a least one portion of said connecting element (i.e. a portion of said nanowires).

Figure 15:
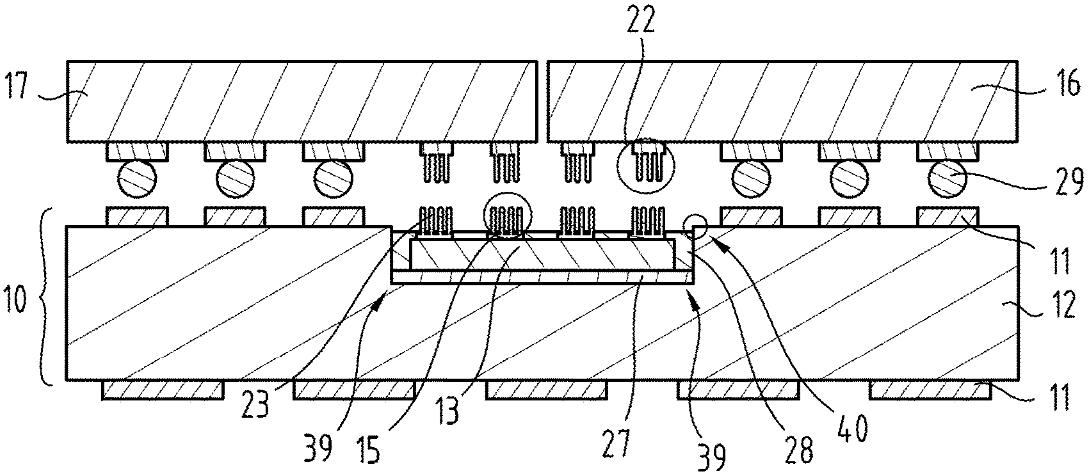

FIG. 15 shows an embodiment of a package with a stack 10 with a recess 39 to receive the component 13, a damping structure 27 and an encapsulant 28, similar to the embodiment depicted in FIG. 4. In the embodiment of FIG. 15, this encapsulant 28 does not fill completely the recess 39, resulting in a step between the upper surface of the encapsulant 28 and the upper surface of the stack 10—as shown in detail 40 of FIG. 15—corresponding to the recess edge; this edge can be used as an additional grasping element for an eventual underfill/insulating material provided between the component 13 and the external component(s) 16, 17, improving the contact surface of the underfill/insulating material with the stack 10.

LIST OF REFERENCE NUMERALS

1 Circuit board
2 Package balls
3 Package substrate
4 Bridge
5 Die
6 Chip
7 Solder bumps
8 Traces
9 Package lid
10 Stack
11 Electrically conductive structure
12 Electrically insulating structure
13 Component
14 Conductive surface
15 Connecting element
16 External component
17 External component
18 Conductive surface
19 Conductive surface
20 Electrically conductive structure
21 Solder bump
22 Connecting element
23 Nanowires
24 Nanowires
25 Pad
26 Pad
27 Damping structure
28 Encapsulant
29 Solder bump
30 Rubber particles
31 Porous material
32 Encapsulant layer
33 Liquid metal
34 Copper pillar
35 Connecting element
36 Underfill structure
37 Overmould structure
38 Pad
39 Recess

The invention claimed is:

1. A component carrier comprising:

a stack comprising a plurality of electrically conductive layer structures and at least one electrically insulating layer structure arranged in a vertical direction, and a component recessed in and/or positioned on a main surface of the stack, said component comprising at least one electrically conductive surface connected to an electrically conductive connecting element, said connecting element extending from said electrically conductive surface away from the stack and configured to be connected to at least one external component to be mounted on the component carrier when at least one connecting surface provided in/on the external component is faced to the electrically conductive surface of the component, wherein:

the connecting element is made of a heterogeneous conductive structure comprising different materials in different states of aggregation that is arranged to permanently compensate for a relative movement between said electrically conductive surface of the component and said connecting surface of the external component, and the main surface of the component is inclined relative to the main surface of the stack and/or misaligned relative to the main surface of the stack along a plane of the main surface of the stack.

2. The component carrier according to claim 1, wherein the heterogeneous structure of the connecting element comprises a solid electrically conductive material with voids inside.

3. The component carrier according to claim 1, wherein the heterogeneous structure comprises a plurality of electrically conductive nanowires spaced apart from each other, connected to the electrically conductive surface and extending away from the stack.

4. The component carrier according to claim 3, wherein each one of said plurality of nanowires is connected to and/or bonded to and/or monolithically merged from the electrically conductive surface.

5. The component carrier according to claim 1, wherein the heterogeneous structure comprises an electrically conductive porous material connected to the electrically conductive surface.

6. The component carrier according to claim 1, wherein the heterogeneous structure comprises a liquid metal structure connected to the electrically conductive surface.

7. The component carrier according to claim 1, wherein the heterogeneous structure comprises a solder bump with rubber particles inside.

8. The component carrier according to claim 1, wherein the stack comprises at least one exposed electrically conductive surface on the main surface of the stack where the component is exposed, said at least one exposed electrically conductive surface being connected to an external conductive structure extending from the at least one exposed electrically conductive surface and configured to expose a surface at a higher vertical level than that of the at least one exposed electrically conductive surface.

9. The component carrier according to claim 1, wherein a damping structure is provided between the component and the stack.

10. The component carrier according to claim 1, wherein the main surface of the component is inclined relative to the main surface of the stack, and:

a difference in a vertical distance along the vertical direction between opposed planar extremities of the main surface of the component and the main surface of the stack is from 0.1 μm to 10 μm, and/or the main surface of the component is inclined at an angle of 0.5° to 10° relative to the main surface of the stack.

11. The component carrier according to claim 1, wherein the main surface of the component carrier is misaligned relative to the main surface of the stack by a distance of 0.1 μm to 10 μm along the plane of the stack.

12. A package, comprising:

a stack comprising a plurality of electrically conductive layer structures and at least one electrically insulating layer structure arranged in a vertical direction, a component recessed in and/or positioned on a main surface of the stack, said component comprising at least one electrically conductive surface, and at least one external component, said external component comprising at least one connecting surface, wherein:

said component and said at least one external component are electrically connected to each other, with the at least one electrically conductive surface of the component and the at least one connecting surface of the external component facing each other, by at least one connecting element, the at least one connecting element is made of a heterogeneous conductive structure comprising different materials in different states of aggregation that is arranged to permanently compensate for a relative movement between said electrically conductive surface of the component and said connecting surface of the external component, and the main surface of the component is inclined relative to the main surface of the stack and/or misaligned relative to the main surface of the stack along a plane of the main surface of the stack.

13. The package according to claim 12, wherein the connecting element comprises:

a first element connected to the at least one electrically conductive surface of the component, and a second element connected to the at least one connecting surface of the external component, wherein the first element and the second element are connected to each other providing the electrical connection between the at least one electrically conductive surface of the component with the at least one connecting surface of the external component.

14. The package according to claim 13, wherein the first element and the second element are connected to each other through their mutual frontal contact, said frontal contact is provided by the extremity of each element opposed to the extremity in contact/associated with the at least one electrically conductive surface of the component or the at least one connecting surface of the external component.

15. The package according to claim 14, wherein the heterogeneous structure comprises a plurality of electrically conductive nanowires distanced spaced apart to each other, one group of the plurality of electrically conductive nanowires being connected to the electrically conductive surface of the stack and extended extending away from the stack and another group of the plurality of electrically conductive nanowires being connected to the electrically conductive surface of the external component, with the respective pluralities of electrically conductive nanowires of the opposing groups being connected to each other by an at least partial intertangle of the respective nanowires of the opposing groups.

16. The package according to claim 14, wherein said frontal contact is provided by the extremity of each element opposed to the extremity in contact/associated with the at least one electrically conductive surface of the component or the at least one connecting surface of the external component.

17. The package according to claim 13, wherein the connecting element and/or the first element and/or the second element is deformed at a contact portion with the respective at least one electrically conductive surface or at least one connecting surface or an opposing one of the first element or the second element.

18. The package according to claim 10, wherein the connecting element and/or the first element and/or the second element are at least partially covered by a protecting material.

19. The package according to claim 12, wherein the component is configured to be connected to at least two external components.

20. The package according to claim 19, wherein the component has a bridge function.

21. The package according to claim 19, wherein:

the at least two external components comprise a first external component that is misaligned along the vertical direction with respect to a second external component; and the component, the first external component and the second external component are enclosed in an overmold structure.

22. The package according to claim 21, wherein a main surface of the first external component is not parallel with a main surface of the second external component.

* * * * *